Nov. 17, 1970 R. S. EHLE 3,540,952

PROCESS FOR FABRICATING SEMICONDUCTOR LASER DIODES

Filed Jan. 2, 1968

Inventor:
Roger S. Ehle by Marvin Snyder
His Attorney.

3,540,952

PROCESS FOR FABRICATING SEMICONDUCTOR LASER DIODES

Roger S. Ehle, Schenectady, N.Y., assignor to General Electric Company, a corporation of New York Filed Jan. 2, 1968, Ser. No. 695,102
Int. Cl. H01l 7/44
U.S. Cl. 148—189 12 Claims

ABSTRACT OF THE DISCLOSURE

Injection laser diodes with low stimulated emission thresholds, high differential quantum efficiencies, and negligible stimulated emission delays are fabricated by diffusing zinc into N-type gallium arsenide wafers at a temperature preferably between 750° C. and 770° C. in an evacuated quartz capsule which is subsequently fast quenched in water. This is followed by a short duration arsenic heat treatment in an evacuated quartz capsule which is thereafter fast quenched in water.

INTRODUCTION

This invention relates to a method of fabricating semiconductor diodes, and more particularly to a method of forming P-N junctions in gallium arsenide to produce laser diodes by diffusion and heat treatment.

Since the advent of semiconductor junction lasers, also known as injection lasers, efforts have been made to produce gallium arsenide laser diodes with improved lasing properties. The present invention concerns a process for effectuating a marked improvement in these properties. This process facilitates ease of fabricating laser diodes by employing diffusion at a temperature lower than has heretofore been deemed practicable. When the diffusion step is followed by an annealing step, the laser diodes which result exhibit better operating characteristics at and near room temperatures than prior gallium arsenide laser diodes. Moreover, the process of the invention results in improved reproducibility of the diodes. Furthermore, when laser diodes are fabricated by diffusion at 850° C., which is conventional in the art, the operating characteristics of the laser vary according to the type of dopants present in the wafer used in fabricating the diode, while lasers fabricated according to the instant invention are independent of the conductivity-type determining dopants present in the wafer at the outset of diffusion.

Accordingly, one object of the invention is to provide a method of making injection lasers having improved operating characteristics at room temperature.

Another object is to provide a method of making semiconductor junction lasers of low stimulated emission threshold, high differential quantum efficiency, and negligible stimulated emission delay.

Another object is to provide a method of making gallium arsenide laser diodes with improved reproducibility by diffusing dopants into gallium arsenide wafers of predetermined conductivity type at lower temperatures than have heretofore been deemed practicable.

Another object is to provide a method of making injection lasers for room temperature operation by diffusing zinc into N-type gallium arsenide in the same manner regardless of the type of donor impurities therein.

Briefly, in accordance with a preferred embodiment of the invention, a method of fabricating P-N junctions of improved characteristics in gallium arsenide injection lasers is provided. This method comprises the steps of diffusing conductivity determining impurities of one conductivity type into a gallium arsenide wafer of opposite conductivity type maintained at a constant temperature between 700° C. and 800° C. for a first predetermined duration in order to form a P-N junction region therein, and abruptly cooling the wafer upon expiration of the first predetermined duration. These steps are followed by heat treating the wafer in an arsenic atmosphere for a second predetermined duration, and abruptly cooling the wafer upon expiration of the second predetermined duration. The laser diode structure may then be completed by removing a sufficient portion of the material of the wafer so as to leave only one planar P-N junction therein, cleaving the wafer into bars so as to establish plane parallel reflecting surfaces on either side of each of the bars perpendicular to the junction, and thereafter dicing the bars into a plurality of individual dies.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF TYPICAL EMBODIMENTS

In practicing the invention, gallium arsenide injection laser diodes are produced by diffusing P-type impurities into N-type gallium arsenide wafers. The N-type wafers may be doped with tellurium, selenium or tin donor impurities. The laser diodes which are produced by the process of the instant invention are independent of the type of donor impurities therein, unlike those diodes which are produced by the conventional 850° C. diffusion process.

Figure 1:
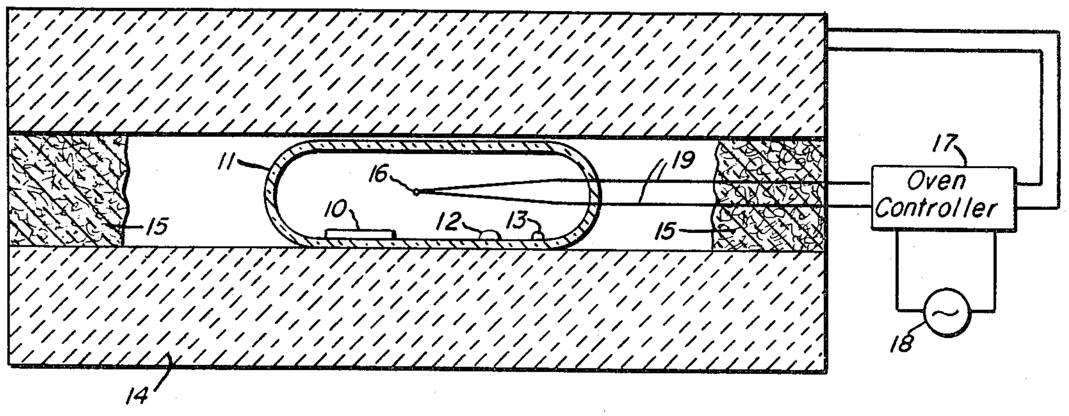
FIG. 1 is a schematic diagram of apparatus utilized in carrying out the diffusion step of the invention.

Prior to diffusion, one of the major faces of the N-type wafer is either mechanically polished, or chemically etched in a methanol-3% bromine solution, in order to prepare the wafers for diffusion. As shown in FIG. 1, a wafer 10 which has thus been prepared for diffusion is sealed within an evacuated quartz tube 11 together with a quantity of zinc 12 and a quantity of arsenic 13. The zinc and arsenic are present in a 1 to 2 ratio by weight. Quartz capsule 11 is inserted into a tubular chamber of an electrically controlled oven 14, and each end of the tubular chamber is closed with quartz wool 15 so as to provide heat insulation. Temperature within capsule 11 is sensed by a thermocouple 16 which operates an oven controller 17. Controller 17 receives power from a power source 18 and regulates the temperature of oven 14 in accordance with the temperature within capsule 11 as sensed by thermocouple 16. The thermocouple wires 19 are conveniently surrounded by quartz wool insulation 15 at one end of oven 14, and are in contact with the wall of capsule 11.

The zinc diffusion occurs at temperatures in the range of 700–800° C., typically between 750° C. and 770° C. for 4 to 5 hours, specifically such as 755° C. for 5 hours. At these temperatures, zinc 12 and arsenic 13 combine to form a zinc diarsenide diffusion source. The presence of arsenic during the diffusion process prevents deterioration of the surface of gallium arsenide wafer 10 due to thermal decomposition thereof. Upon completion of the 5 hour zinc diffusion, the capsule is removed from the oven and fast quenched in water.

After the diffusion process has been completed, the wafer is annealed by subjecting it to a heat treatment in an arsenic atmosphere. This is accomplished by sealing zinc diffused wafer 10, together with a quantity of arsenic, within an evacuated capsule similar to capsule 11 of FIG. 1. The heat treatment takes place within oven 14 for about a half hour at a temperature between 900° C. and 980° C., as selected by adjusting oven controller 17. Typically, the heat treatment is carried out at a temperature of 970° C. for one half hour. The capsule is then removed from the oven and fast quenched in water.

The wafer is thereafter removed from its capsule and, since P-type impurities are diffused into all its surfaces, the wafer is lapped down on the unpolished major surface opposite the polished major surface so as to remove the superfluous P-N junction formed in the material directly beneath the unpolished major surface. Typically, the wafer is lapped to a thickness of about 6 or 7 mils. The wafer is then cleaved into bars, thereby producing parallel reflecting surfaces perpendicular to the plane of the junction in each of the bars. Each bar is then diced into a plurality of dies, as by sandblasting the bars through a metal mask. Each die may then be mounted individually on a header utilizing an N-type solder, such as a silver-tin alloy, to make contact with the N-type region of the die, while contact to the P-type region may be made with a gold thermocompression bond. A heat sink may then be attached to the resulting device so as to provide high thermal conductivity therefor and minimize P-N junction heating; however, the heat sink is not essential to achieve laser operation at room temperature.

As a result of the foregoing process, injection laser diodes of characteristics superior to those achieved by conventional diffusion processes may be prepared. For example, increases in differential quantum efficiency, which may be described as the ratio of the rate of increase in the number of output photons produced by the diode to the rate of increase in the number of input electrons supplied to the diode once stimulated emission of radiation has begun, have been achieved. In addition, decreases of at least 50 percent in stimulated emission threshold, or minimum current density required to produce stimulated emission of radiation, have also been achieved. The stimulated emission delay, or time interval between application of stimulated emission threshold current and onset of stimulated emission of radiation, has been negligible for diodes prepared in the aforementioned manner; that is, less than 20 nanoseconds. Moreover, the process yields good laser diodes for room temperature operation regardless of what N-type dopant of the wafer is utilized, and is highly reproducible.

In order to measure stimulated emission threshold and differential quantum efficiency, triangular current pulses derived from an R-C charge circuit were supplied to laser diodes fabricated according to the invention and maintained in an ambient of about 300° K. The pulse repetition rate was 20 cycles per second, with each pulse having a rise time of approximately 15 nanoseconds and a duration of about 40 nanoseconds at the half power points. In performing measurements of efficiency, threshold and delay, light output of the laser diodes was sensed conveniently by a calibrated F-4000 phototube, made by International Telephone and Telegraph Company, operated with a 900 volt bias.

Although the reasons for the improved performance of lasers fabricated according to the process of the instant invention are not entirely understood, it is believed that much of this improvement is due to the fact that the concentration gradient has been more closely optimized for laser operation, particularly in a 300° K. ambient; that is, radiation wave propagation within the laser is confined to a region in which absorption losses are smaller. At the same time, an optimum impurity concentration profile which satisfies the conditions for population inversion is achieved. This is evident after heat treatment of the diode fabricated by the 755° C. diffusion, since a knee is found to exist in the concentration profile for that diode in a region very close to the junction, as illustrated by the intersection of the 755° C. diffusion profile with the dotted line in FIG. 2.

Figure 2:
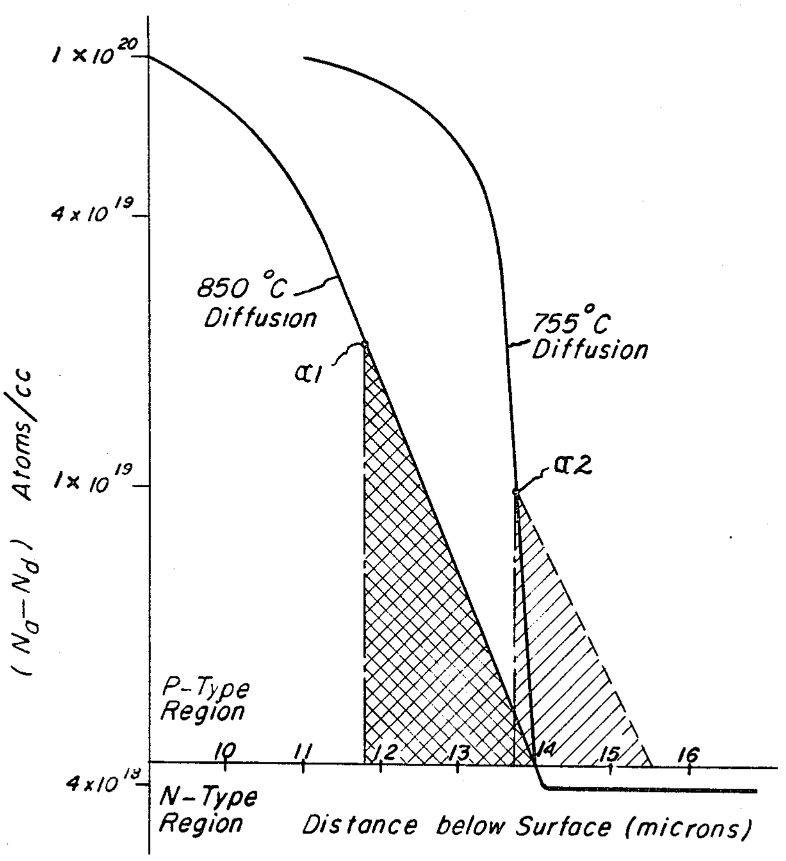
FIG. 2 illustrates impurity concentration profiles for each of a pair of gallium arsenide diodes, one of which is fabricated according to the invention and the other fabricated by a conventional diffusion process.

As illustrated in FIG. 2, with net concentration of impurity atoms per cubic centimeter of gallium arsenide plotted on an ordinate, wherein $N_a$ is the acceptor atom concentration per cubic centimeter and $N_d$ is the donor atom concentration per cubic centimeter, a steeper concentration gradient near the P-N junction, which corresponds to the abscissa, exists for diodes diffused at 755° C. in comparison with diodes diffused at a conventional 850° C. In order to position the P-N junctions for the 755° C. diffusion and the 850° C. diffusion at approximately 15 microns below the wafer surface, the diffusion time for the 850° C. diffusion is made shorter than the diffusion time for the 755° C. diffusion. This causes the concentration profiles for the wafers after diffusion to intersect approximately at the same depth below the surface of the wafer.

It is well-known to those skilled in the art that changes in the index of refraction near the active region in a laser diode play an important role in beam confinement, as evidenced, for example, by F. Stern, Radiation Confinement in Semiconductor Lasers, 7th International Conference on the Physics of Semiconductors, Paris (1964), p. 165 (Dunod 1965). Thus, for the 755° C. diffusion followed by the heat treatment, the rapid change of the P-type concentration with respect to distance, in a region just above the knee, causes a sharp change in the index of refraction, confining the beam to a small region indicated by the single cross-hatching. On the other hand, for the 850° C. diffusion, the more gradual P-type impurity concentration change with respect to distance, in a region close to the P-N junction, causes a less rapid change in the index of refraction and thus allows wave propagation in the double cross-hatched region including the region overlapping into the single cross-hatched region.

As shown in FIG. 2, light absorption ($\alpha_2$) in the case of the 755° C. diffusion plus heat treatment occurs in the P-type region at a concentration of acceptors considerably smaller than the concentration of acceptors at which light absorption ($\alpha_1$) for the 850° C. diffusion occurs. This is because the light beam is less confined in the diode diffused at 850° C. than in the diode diffused at 755° C. and heat treated, as preivously explained. Thus, since much of the light absorption is due to presence of acceptor impurity atoms, much more absorption of light occurs in the diode fabricated with the 850° C. diffusion than in the diode fabricated with the 755° C. diffusion plus heat treatment. This is consistent with the higher differential quantum efficiency and lower stimulated emission threshold obtained in diodes fabricated with the 755° C. diffusion plus heat treatment.

If the 755° C. diffusion is used alone, the resulting diode is not very satisfactory as a laser since photon generation occurs in an area of high absorption. Moreover, there is no sharp discontinuity of refractive index in this region to prevent the beam from propagating into a still more highly absorbing region, so that a very high current density would be required in order to achieve lasing. This would make the laser impractical for room temperature operation. The effect of the heat treatment following the 755° C. diffusion, however, is to add the knee, as indicated by the dotted line in FIG. 2, to the 755° C. diffusion. Lasing thus becomes attainable at very low current densities, resulting in highly efficient laser operation at room temperatures. This is because the heat treatment provides a concentration profile in the knee region where injected electron recombination is most efficient. Accordingly, photon generation is most efficient in this region. The steep concentration gradient obtained with the 755° C. diffusion serves to confine the propagating beam to the region of low absorption. The overall result combines the advantageous features of the efficient photon generation resulting from the heat treatment with the better beam confinement resulting from a low temperature diffusion, to arrive at a device which is superior to that produced by the 850° C. diffusion alone.

In fabricating a typical laser diode according to the invention, a wafer of about 20 mils in thickness and 1 centimeter square is first cut along the <100> plane from a monocrystalline ingot doped with selenium to a concentration of $4.8 \times 10^{18}$ atoms per cubic centimeter. One major surface of the wafer is chemically polished in a methanol-3% bromine solution. The wafer is next sealed inside an evacuated quartz capsule together with about 2.5 milligrams of zinc and about 5.0 milligrams of arsenic. The capsule is then placed in an oven and maintained at a temperature of 755° C. for about 5 hours, during which time the zinc diffuses into the wafer through all surfaces thereof. After the five hour diffusion period, the capsule is removed from the oven and fast quenched in water. The wafer is then removed from the capsule and sealed inside a new evacuated capsule together with 5 milligrams of arsenic. The new capsule is heated in the oven at a temperature of 970° C. for about one half hour, so as to anneal the wafer in an arsenic atmosphere. After the one half hour annealing period, the capsule is removed from the oven and fast quenched in water. The wafer is then removed from the capsule and lapped on its unpolished major surface so as to reduce the wafer thickness to approximately 6 mils. The wafer is next cleaved into bars so as to form parallel reflecting surfaces perpendicular to the plane of the junction in each bar. A metal mask is then placed over each of the bars and the bars are diced, by sandblasting, into units approximately 10 mils in length by 5 mils in width. Finally, the N-type side of a unit or die is soldered to a header by use of a silver-tin alloy, and contact is made with the P-type region by a gold thermocompression bond.

The foregoing describes a method of making injection lasers having improved operating characteristics at room temperature. The lasers, which may be made in a highly reproducible fashion, exhibit low stimulated emission thresholds, high differential quantum efficiencies and negligible stimulated emission delays. Further, by use of the present invention, a gallium arsenide laser diode may be made by diffusing dopants therein at lower temperatures than have heretofore been deemed practicable.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

I claim:

1. A method of fabricating P-N junctions in gallium arsenide injection lasers comprising the steps of:
diffusing acceptor impurities for a first predetermined duration into an N-type gallium arsenide wafer maintained at a constant temperature in the range of 700° C.–800° C. so as to form a P-N junction region therein;
cooling said wafer abruptly to substantially room temperature upon expiration of said first predetermined duration;
heat treating said wafer for a second predetermined duration in an arsenic atmosphere at a temperature above said constant temperature; and
cooling said wafer abruptly to substantially room temperature upon expiration of said second predetermined duration.

2. The method of fabricating P-N junctions in gallium arsenide injection lasers of claim 1 wherein said constant temperature is in the range of 750° C.–770° C.

3. The method of fabricating P-N junctions in gallium arsenide injection lasers of claim 1 wherein said temperature above said constant temperature is in the range of 900° C.–980° C.

4. The method of fabricating P-N junctions in gallium arsenide injection lasers of claim 1 wherein said constant temperature is in the range of 750° C.–770° C. and said temperature above said constant temperature is in the range of 900° C.–980° C.

5. The method of fabricating P-N junctions in gallium arsenside injection lasers of claim 1 wherein said constant temperature is substantially 755° C. and said temperature above said constant temperature is substantially 970° C.

6. The method of fabricating P-N junctions in gallium arsenide injection lasers of claim 1 wherein said N-type gallium arsenide includes donor impurities of the group consisting of selenium, tellurium and tin, and said acceptor impurities comprise zinc.

7. The method of fabricating P-N junctions in gallium arsenide injection lasers of claim 6 wherein said constant temperature is in the range of 750° C.–770° C.

8. The method of fabricating P-N junctions in gallium arsenide injection lasers of claim 6 wherein said temperature above said constant temperature is in the range of 900° C.–980° C.

9. The method of fabricating P-N junctions in gallium arsenide injection lasers of claim 6 wherein said constant temperature is in the range of 750° C.–770° C. and said temperature above said elevated temperature is in the range of 900° C.–980° C.

10. The method of fabricating P-N junctions in gallium arsenide injection lasers of claim 6 wherein said constant temperature is substantially 755° C. and said temperature above said elevated temperature is substantially 970° C.

11. A method of fabricating gallium arsenide laser diodes for room temperature operation comprising the steps of:
diffusing impurities for determining one conductivity type into a gallium arsenide wafer of opposite conductivity type at a constant temperature in the range of 750° C.–770° C. to form a P-N junction region therein;
cooling said wafer abruptly upon completing the diffusing of said impurities into said wafer;
annealing said wafer in an arsenic atmosphere at a temperature in the range of 900° C.–980° C.; and
cooling said wafer abruptly upon completing the annealing of said wafer.

12. The method of fabricating gallium arsenide laser diodes for room temperature operation of claim 11 including the additional steps of:
removing a sufficient portion of material of said wafer so as to leave only one planar P-N junction in said wafer;
cleaving said wafer into bars so as to establish plane parallalel reflecting surfaces on either side of each of said bars perpendicular to the planar P-N junction in each of said bars; and
dividing each of said bars into a plurality of dice.

References Cited

UNITED STATES PATENTS 3,305,412 2/1967 Pizzarello ---------- 148—189

L. DEWAYNE RUTLEDGE, Primary Examiner

R. A. LESTER, Assistant Examiner

U.S. Cl. X.R.

148—187, 188; 317—237